US007202149B2

(12) United States Patent
Fujikawa et al.

(10) Patent No.: US 7,202,149 B2
(45) Date of Patent: Apr. 10, 2007

(54) SEMICONDUCTOR DEVICE AND MANUFACTURING METHOD THEREOF

(75) Inventors: Saishi Fujikawa, Kanagawa (JP); Etsuko Asano, Kanagawa (JP); Tatsuya Arao, Yamanashi (JP); Takashi Yokoshima, Kanagawa (JP); Takuya Matsuo, Osaka (JP); Hidehito Kitakado, Nara (JP)

(73) Assignees: Semiconductor Energy Laboratory Co., Ltd., Atsugi-shi, Kanagawa-ken (JP); Sharp Kabushiki Kaisha Co., Ltd., Osakai-shi, Osaka (JP)

( * ) Notice: Subject to any disclaimer, the term of this patent is extended or adjusted under 35 U.S.C. 154(b) by 241 days.

(21) Appl. No.: 11/010,389

(22) Filed: Dec. 14, 2004

(65) Prior Publication Data

US 2005/0133862 A1 Jun. 23, 2005

(30) Foreign Application Priority Data

Dec. 22, 2003 (JP) ............................ 2003-424364

(51) Int. Cl.
*H01L 21/4763* (2006.01)
*H01L 21/3205* (2006.01)

(52) U.S. Cl. .............................. 438/588; 257/E21.179

(58) Field of Classification Search ........ 257/E21.179; 438/588

See application file for complete search history.

(56) References Cited

U.S. PATENT DOCUMENTS 6,198,132 B1 * 3/2001 Ishida et al. ................ 257/347
6,774,397 B2 * 8/2004 Arao et al. .................. 257/59
7,094,635 B2 * 8/2006 Yamazaki et al. .......... 438/151
2002/0004262 A1 * 1/2002 Asami et al. ............... 438/166
2002/0028544 A1 * 3/2002 Fujimoto et al. ........... 438/166
2002/0036288 A1 * 3/2002 Ohnuma ...................... 257/56
2002/0053674 A1 * 5/2002 Nakajima et al. ............ 257/72
2003/0124778 A1 * 7/2003 Doi et al. ................... 438/151
2004/0140472 A1 * 7/2004 Fujimoto et al. ............ 257/72
2005/0181610 A1 * 8/2005 Sasagawa et al. .......... 438/689

* cited by examiner

*Primary Examiner*—Asok Kumar Sarkar
(74) *Attorney, Agent, or Firm*—Fish & Richardson P.C.

(57) ABSTRACT

A semiconductor device of which manufacturing steps can be simplified by doping impurities at a time, and a manufacturing method thereof. The manufacturing method of the semiconductor device comprises the steps of: forming first and second semiconductor layers over a substrate, forming a first insulating film over the first and second semiconductor layers, forming first and second conductive films thereover, forming a first gate electrode having a stacked layer of the first and second conductive films, in which a portion of the first conductive film is exposed from the second conductive film, over the first semiconductor layer with the first insulating film interposed therebetween, forming a second insulating film over the first insulating film, forming third and fourth conductive films thereover, and forming a second gate electrode having a stacked layer of the third and fourth conductive films, in which a portion of the third conductive film is exposed from the fourth conductive film, over the second semiconductor layer with the first and second insulating films interposed therebetween.

10 Claims, 3 Drawing Sheets

6b 5a 8 9 11b 10a 13 4 2 14 18 19 15 16 20 21 17 1

SEMICONDUCTOR DEVICE AND MANUFACTURING METHOD THEREOF

BACKGROUND OF THE INVENTION

1. Field of the Invention

The present invention relates to a semiconductor device in which transistors each having a gate insulating film with different thickness are formed on a substrate, and a manufacturing method thereof. In particular, the invention relates to a semiconductor device of which manufacturing steps can be simplified by doping impurities at a time, and a manufacturing method thereof.

2. Description of the Related Art

In manufacture of a CPU and a panel on the same substrate, when forming a thin film transistor of the CPU and a thin film transistor of the panel to have respective gate insulating films with different thickness, steps of doping impurities to a low concentration impurity region (LDD region) and steps of doping impurities to source and drain regions are separately performed on the CPU side and the panel side.

When performing impurity doping separately on the CPU side and the panel side as set forth above, steps are disadvantageously complicated. Thereupon, impurity doping is desirably carried out at a time in order to simplify the steps.

The invention is made in view of the aforementioned problem, and it is an object of the invention to provide a semiconductor device of which manufacturing steps can be simplified by doping impurities at a time, and a manufacturing method thereof.

SUMMARY OF THE INVENTION

In order to solve the aforementioned problem, a manufacturing method of a semiconductor device in accordance with the invention comprises the steps of: forming a first semiconductor layer and a second semiconductor layer over a substrate, forming a first insulating film over the first semiconductor layer and the second semiconductor layer, forming a first conductive film over the first insulating film, forming a second conductive film over the first conductive film, processing the second conductive film and the first conductive film so as to form a first gate electrode having a stacked layer of the second conductive film and the first conductive film, in which a portion of the first conductive film is exposed from the second conductive film, over the first semiconductor layer with the first insulating film interposed therebetween, forming a second insulating film over the first gate electrode and the first insulating film, forming a third conductive film over the second insulating film, forming a fourth conductive film over the third conductive film, and processing the fourth conductive film and the third conductive film so as to form a second gate electrode having a stacked layer of the fourth conductive film and the third conductive film, in which a portion of the third conductive film is exposed from the fourth conductive film, over the second semiconductor layer with the first and second insulating films interposed therebetween.

According to the aforementioned manufacturing method of a semiconductor device, the first insulating film formed between the first semiconductor layer and the first gate electrode functions as a first gate insulating film while the first and second insulating films formed between the second semiconductor layer and the second gate electrode function as a second gate insulating film. Accordingly, a transistor formed on the first semiconductor layer side and a transistor formed on the second semiconductor layer side can be formed to have respective gate insulating films with different thickness.

In addition, according to the manufacturing method of a semiconductor device in accordance with the invention, the first conductive film can be formed to have substantially the same thickness as the third conductive film.

In addition, according to the manufacturing method of a semiconductor device in accordance with the invention, the first conductive film can be formed thinner than the third conductive film.

In addition, according to the manufacturing method of a semiconductor device in accordance with the invention, the first conductive film can be formed thicker than the third conductive film.

In addition, according to the manufacturing method of a semiconductor device in accordance with the invention, the first conductive film can be formed to have a different thickness from that of the third conductive film.

According to the manufacturing method of a semiconductor device in accordance with the invention, after the formation of the second gate electrode over the second semiconductor layer with the first and second insulating films interposed therebetween, the first semiconductor layer and the second semiconductor layer can be doped with impurities through the first insulating film and the second insulating film. Accordingly, the first semiconductor layer and the second semiconductor layer can be doped with substantially the same quantity of impurities.

According to the manufacturing method of a semiconductor device in accordance with the invention, after the formation of the second gate electrode over the second semiconductor layer with the first and second insulating films interposed therebetween, the first semiconductor layer and the second semiconductor layer can be doped with impurities through the third conductive film exposed from the fourth conductive film, the first conductive film exposed from the second conductive film, the first insulating film and the second insulating film. Accordingly, the first semiconductor layer and the second semiconductor layer can be doped with substantially the same quantity of impurities.

According to the manufacturing method of a semiconductor device in accordance with the invention, after the formation of the second gate electrode over the second semiconductor layer with the first and second insulating films interposed therebetween, the first semiconductor layer and the second semiconductor layer can be doped with impurities through the third conductive film exposed from the fourth conductive film, the first conductive film exposed from the second conductive film, the first insulating film and the second insulating film, thereby forming a high concentration impurity region and a low concentration impurity region in each of the first semiconductor layer and the second semiconductor layer.

A manufacturing method of a semiconductor device in accordance with the invention comprises the steps of: forming a first semiconductor layer and a second semiconductor layer over a substrate, forming a first insulating film over the first semiconductor layer and the second semiconductor layer, forming a first conductive film over the first insulating film, forming a second conductive film over the first conductive film, processing the second conductive film and the first conductive film so as to form a first gate electrode having a stacked layer of the second conductive film and the first conductive film, in which a portion of the first conductive film is exposed from the second conductive film, over the first semiconductor layer with the first insulating film interposed therebetween, forming a second insulating film over the first gate electrode and the first insulating film, forming a third conductive film which is thicker than the first conductive film over the second insulating film, forming a fourth conductive film over the third conductive film, processing the fourth conductive film and the third conductive film so as to form a second gate electrode having a stacked layer of the fourth conductive film and the third conductive film, in which a portion of the third conductive film is exposed from the fourth conductive film, over the second semiconductor layer with the first and second insulating films interposed therebetween, doping first impurities to the first semiconductor layer and the second semiconductor layer through the first insulating film and the second insulating film, and doping second impurities to the first semiconductor layer and the second semiconductor layer through the third conductive film exposed from the fourth conductive film, the first conductive film exposed from the second conductive film, the first insulating film and the second insulating film, wherein the quantity of the second impurities doped to the first semiconductor layer is larger than the second impurities doped to the second semiconductor layer.

According to the aforementioned manufacturing method of a semiconductor device, the third conductive film is formed thicker than the first conductive film. Accordingly, the impurity region formed in the first semiconductor layer by the second impurities have higher concentration than the impurity region formed in the second semiconductor layer by the second impurities, therefore, the first and semiconductor layers can be doped with impurities at a time even in the case where the first semiconductor layer is doped with a larger quantity of impurities than the second semiconductor layer.

A manufacturing method of a semiconductor device in accordance with the invention comprises the steps of: forming a first semiconductor layer and a second semiconductor layer over a substrate, forming a first insulating film over the first semiconductor layer and the second semiconductor layer, forming a first conductive film over the first insulating film, forming a second conductive film over the first conductive film, processing the second conductive film and the first conductive film so as to form a first gate electrode having a stacked layer of the second conductive film and the first conductive film, in which a portion of the first conductive film is exposed from the second conductive film, over the first semiconductor layer with the first insulating film interposed therebetween, forming a second insulating film over the first gate electrode and the first insulating film, forming a third conductive film which is thinner than the first conductive film over the second insulating film, forming a fourth conductive film over the third conductive film, processing the fourth conductive film and the third conductive film so as to form a second gate electrode having a stacked layer of the fourth conductive film and the third conductive film, in which a portion of the third conductive film is exposed from the fourth conductive film, over the second semiconductor layer with the first and second insulating films interposed therebetween, doping first impurities to the first semiconductor layer and the second semiconductor layer through the first insulating film and the second insulating film, and doping second impurities to the first semiconductor layer and the second semiconductor layer through the third conductive film exposed from the fourth conductive film, the first conductive film exposed from the second conductive film, the first insulating film and the second insulating film, wherein the quantity of the second impurities doped to the first semiconductor layer is smaller than the second impurities doped to the second semiconductor layer.

A semiconductor device in accordance with a invention comprises: a first semiconductor layer formed over a substrate, a second semiconductor layer formed over the substrate, a first insulating film formed over the first semiconductor layer and the second semiconductor layer, a first gate electrode having a stacked layer of a first conductive film and a second conductive film formed over the first semiconductor layer with the first insulating film interposed therebetween, in which the second conductive film is stacked on the first conductive film and a portion of the first conductive film is exposed from the second conductive film, a second insulating film formed over the first insulating film, and a second gate electrode having a stacked layer of a third conductive film and a fourth conductive film formed over the second semiconductor layer with the first insulating film and the second insulating film interposed therebetween, in which the fourth conductive film is stacked on the third conductive film and a portion of the third conductive film is exposed from the fourth conductive film.

According to the aforementioned semiconductor device, the first insulating film formed between the first semiconductor layer and the first gate electrode functions as a first gate insulating film while the first and second insulating films formed between the second semiconductor layer and the second gate electrode function as a second gate insulating film. Accordingly, a transistor formed on the first semiconductor layer side and a transistor formed on the second semiconductor layer side have respective gate insulating films with different thickness.

According to the semiconductor device in accordance with the invention, source and drain regions can be further provided in each of the first semiconductor layer and the second semiconductor layer by doping impurities to the first semiconductor layer and the second semiconductor layer through the first insulating film and the second insulating film.

In addition, according to the semiconductor device in accordance with the invention, an LDD region can be further provided in each of the first semiconductor layer and the second semiconductor layer by doping impurities to the first semiconductor layer and the second semiconductor layer through the third conductive film exposed from the fourth conductive film, the first conductive film exposed from the second conductive film, the first insulating film and the second insulating film.

In addition, according to the semiconductor device in accordance with the invention, a high concentration impurity region and a low concentration impurity region can be further provided in each of the first semiconductor layer and the second semiconductor layer by doping impurities to the first semiconductor layer and the second semiconductor layer through the third conductive film exposed from the fourth conductive film, the first conductive film exposed from the second conductive film, the first insulating film and the second insulating film.

In addition, according to the semiconductor device in accordance with the invention, the first conductive film can be formed to have substantially the same thickness as the third conductive film.

In addition, according to the semiconductor device in accordance with the invention, the first conductive film can be formed thinner than the third conductive film so that the low concentration impurity region formed in the first semiconductor layer can have a higher impurity concentration than the low concentration impurity region formed in the second semiconductor layer.

In addition, according to the semiconductor device in accordance with the invention, the first conductive film can be formed thicker than the third conductive film so that the low concentration impurity region formed in the first semiconductor layer can have a lower impurity concentration than the low concentration impurity region formed in the second semiconductor layer.

According to the semiconductor device in accordance with the invention, the first conductive film can be formed to have a different thickness from that of the third conductive film so that the LDD region formed in the first semiconductor layer can have a different impurity concentration from the LDD region formed in the second semiconductor layer.

A semiconductor device in accordance with the invention comprises: a first semiconductor layer formed over a substrate, a second semiconductor layer formed over the substrate, a first insulating film formed over the first semiconductor layer and the second semiconductor layer, a first gate electrode having a stacked layer of a first conductive film and a second conductive film formed over the first semiconductor layer with the first insulating film interposed therebetween, in which the second conductive film is stacked on the first conductive film and a portion of the first conductive film is exposed from the second conductive film, a second insulating film formed over the first insulating film, a second gate electrode having a stacked layer of a third conductive film which is thicker than the first conductive film and a fourth conductive film over the second semiconductor layer with the first insulating film and the second insulating film interposed therebetween, in which the fourth conductive film is stacked on the third conductive film and a portion of the third conductive film is exposed from the fourth conductive film, source and drain regions formed in each of the first semiconductor layer and the second semiconductor layer by doping first impurities to the first semiconductor layer and the second semiconductor layer through the first insulating film and the second insulating film, and a low concentration impurity regions formed in each of the first semiconductor layer and the second semiconductor layer by doping second impurities to the first semiconductor layer and the second semiconductor layer through the third conductive film exposed from the fourth conductive film, the first conductive film exposed from the second conductive film, the first insulating film and the second insulating film, wherein the low concentration impurity region formed in the first semiconductor layer has a higher impurity concentration than the low concentration impurity region formed in the second semiconductor layer.

According to the aforementioned semiconductor device, the third conductive film is formed thicker than the first conductive film. Accordingly, the first and second semiconductor layers can be doped with impurities at a time even in the case where the first semiconductor layer is doped with a larger quantity of impurities than the second semiconductor layer. Accordingly, an LDD region formed in the first semiconductor layer can have a higher concentration than an LDD region formed in the second semiconductor layer.

A semiconductor device in accordance with the invention comprises a first semiconductor layer formed over a substrate, a second semiconductor layer formed over the substrate, a first insulating film formed over the first semiconductor layer and the second semiconductor layer, a first gate electrode having a stacked layer of a first conductive film and a second conductive film formed over the first semiconductor layer with the first insulating film interposed therebetween, in which the second conductive film is stacked on the first conductive film and a portion of the first conductive film is exposed from the second conductive film, a second insulating film formed over the first insulating film, a second gate electrode having a stacked layer of a third conductive film which is thinner than the first conductive film and a fourth conductive film formed over the second semiconductor layer with the first insulating film and the second insulating film interposed therebetween, in which the fourth conductive film is stacked on the third conductive film and a portion of the third conductive film is exposed from the fourth conductive film, source and drain regions formed in each of the first semiconductor layer and the second semiconductor layer by doping first impurities to the first semiconductor layer and the second semiconductor layer through the first insulating film and the second insulating film, and low concentration impurity regions formed in each of the first semiconductor layer and the second semiconductor layer by doping second impurities to the first semiconductor layer and the second semiconductor layer through the third conductive film exposed from the fourth conductive film, the first conductive film exposed from the second conductive film, the first insulating film and the second insulating film, wherein the low concentration impurity region formed in the first semiconductor layer has a lower impurity concentration than the low concentration impurity region formed in the second semiconductor layer.

As set forth above, according to the invention, a semiconductor device of which manufacturing steps can be simplified by doping impurities at a time, and a manufacturing method thereof can be provided.

DETAILED DESCRIPTION OF THE PREFERRED EMBODIMENTS

Description is made hereinafter on embodiment modes of the invention with reference to the accompanying drawings.

Embodiment Mode 1

FIGS. 1A to 3 are cross-sectional diagrams illustrating a manufacturing method of a semiconductor device according to Embodiment Mode 1 of the invention.

Figure 1A:
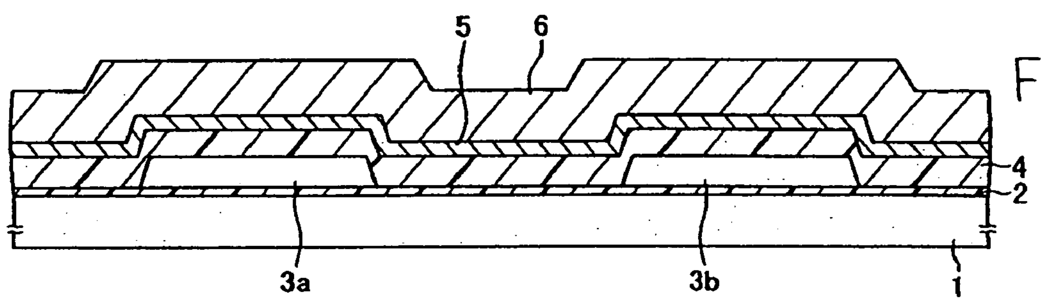
FIGS. 1A to 1C are cross-sectional diagrams illustrating a manufacturing method of a semiconductor device according to Embodiment Mode 1 of the invention.

First, a base insulating film 2 is formed over a substrate 1 as shown in FIG. 1A. The substrate 1 may be a glass substrate, a quartz substrate, a silicon substrate, or a metal or stainless substrate over the surface of which is formed an insulating film. Alternatively, a plastic substrate having heat resistance to processing temperatures may be used.

The base insulating film 2 is a base film formed of an insulating film such as a $SiO_2$ film, a $Si_3N_4$ film and a SiON film. Shown here is an example where the base insulating film 2 has a single layer structure, however, it may have a multilayer structure of two or more layers of the above insulating films. Note that the base insulating film is not necessarily provided.

Then, island-like semiconductor layers (active layers) 3*a* and 3*b* are formed over the base insulating film 2. The semiconductor layers 3*a* and 3*b* are formed by depositing an amorphous semiconductor film by a known method (sputtering, LPCVD, plasma CVD or the like), applying a known crystallization treatment (laser crystallization, thermal crystallization, thermal crystallization by use of catalysts such as nickel and the like) to obtain a crystalline semiconductor film, and subsequently pattering it using a first photomask. Each of the semiconductor layers 3*a* and 3*b* is formed with a thickness of 25 to 80 nm (preferably, 30 to 60 nm). Materials of the crystalline semiconductor films are not specifically limited, however, silicon or silicon germanium (SiGe) alloys and the like are preferably used.

Then, a first insulating film 4 is formed over the island-like semiconductor layers 3*a* and 3*b* and the base insulating film 2. The first insulating film 4 functions as a gate insulating film of a CPU side. The first insulating film 4 is formed of a silicon-containing insulating film (SiON or $SiO_2$, for example) in single or multiple layers using plasma CVD or sputtering. In this embodiment mode, the first insulating film 4 is formed of a $SiO_2$ film having a thickness of 50 nm.

Then, a first conductive film 5 having a thickness of 20 to 100 nm and a second conductive film 6 having a thickness of 100 to 400 nm are formed in this order over the first insulating film 4. Here, the first conductive film 5 formed of a TaN film and the second conductive film 6 formed of a W film are sequentially stacked by sputtering to have a thickness of 30 nm and 370 nm respectively. Note that the first conductive film 5 is formed of a TaN film while the second conductive film 6 is formed of a W film here, however, the invention is not limited to such materials, and each of the conductive films may be formed of an element selected among Ta, W, Ti, Mo, Al and Cu, or alloy or compound materials containing such element as a main component. Alternatively, a semiconductor film typified by a polycrystalline silicon film doped with impurity elements such as phosphorus may be used.

Figure 1B:
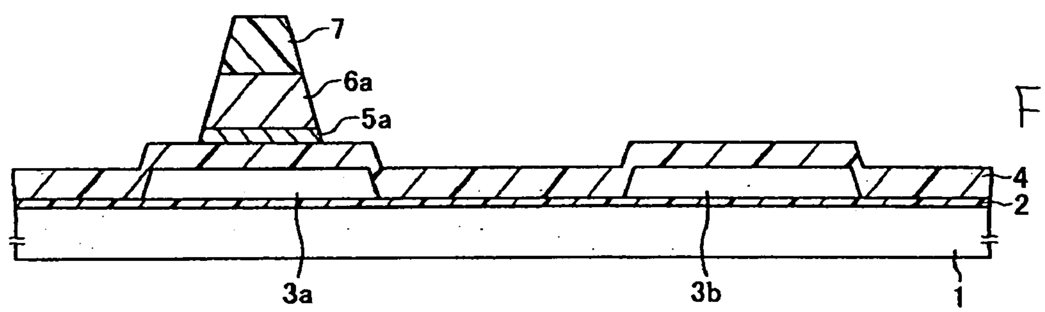

Then, as shown in FIG. 1B, a resist mask 7 is formed by using a second photomask on the second conductive film 6, and a first etching step is applied using an ICP (Inductively Coupled Plasma) etching system. According to the first etching step, the second conductive film 6 is etched to obtain a second conductive film 6*a* having tapered edges.

Then, a second etching step is applied using the resist mask 7 and an ICP etching system. According to the second etching step, the first conductive film 5 is etched to obtain a first conductive film 5*a* as shown in FIG. 1B. That is, the first conductive film 5*a* and the second conductive film 6*a* are formed over the semiconductor layer 3*a* with the first insulating film 4 interposed therebetween. Note that the resist mask, the second conductive film and the first insulating film are slightly etched in the second etching step.

Here, two etching steps (the first etching step and the second etching step) are applied in order to suppress the reduction in thickness of the first insulating film 4, however, the number of etching steps is not specifically limited as long as an electrode structure as shown in FIG. 1B (stacked layer of the second conductive film 6*a* and the first conductive film 5*a*) can be obtained, and an etching step may be applied only once as well.

Figure 1C:
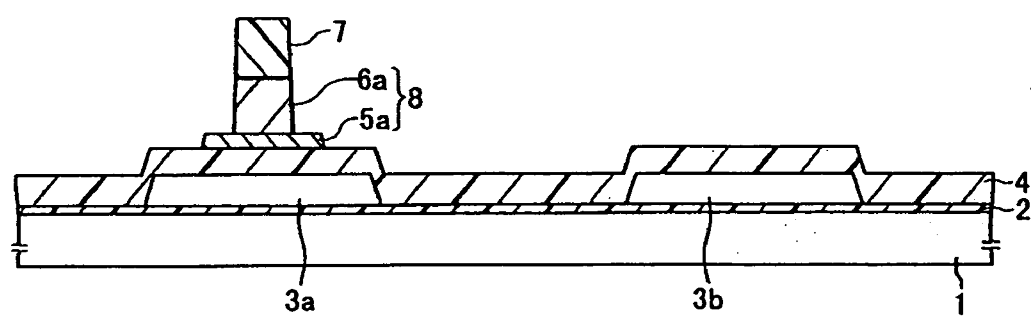

Then, a third etching step is applied using the resist mask 7 and an ICP etching system. According to the third etching step, the second conductive film 6*a* is etched to form a second conductive film 6*b* as shown in FIG. 1C. Accordingly, a first gate electrode 8 having a stacked layer of the first and second conductive films 5*a* and 6*b* is formed. At this time, side faces of the second conductive film 6*b* have a tapered shape. A portion of the first conductive film 5*a* is exposed from the second conductive film 6*b*. Note that the resist mask, the first conductive film and the first insulating film are slightly etched in the third etching step.

Figure 2A:
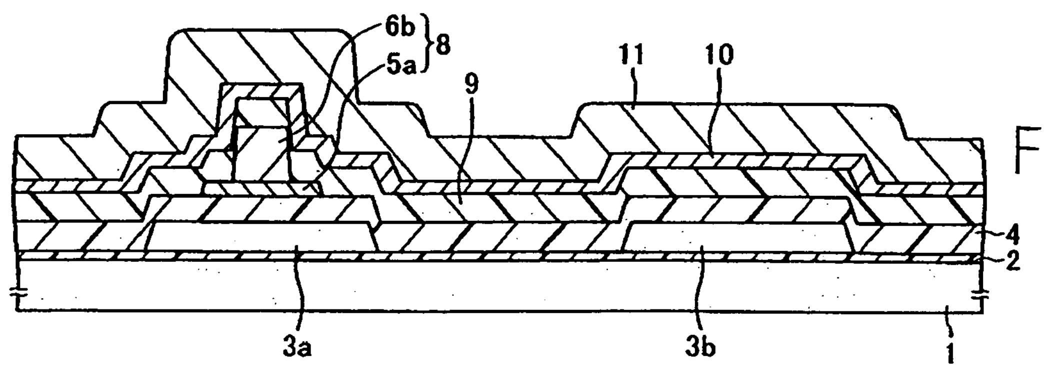
FIGS. 2A to 2C are cross-sectional diagrams illustrating a manufacturing method of a semiconductor device according to Embodiment Mode 1 of the invention, following the step of FIG. 1C.

Then, as shown in FIG. 2A, after removal of the resist mask 7, a second insulating film 9 is formed over the first gate electrode 8 and the first insulating film 4. The second insulating film 9 and the first insulating film 4 function as a gate insulating film of a panel side. The second insulating film 9 is formed of a silicon-containing insulating film (SiON or $SiO_2$) in single or multiple layers using plasma CVD or sputtering. In this embodiment mode, the second insulating film 9 is formed of a $SiO_2$ film to have a thickness of 60 nm.

Then, a third conductive film 10 and a fourth conductive film 11 are sequentially formed over the second insulating film 9 with a thickness of 20 to 100 nm and 100 to 400 nm respectively. At this time, side faces of the second conductive film 6*b* of the first gate electrode 8 have a slight taper angle as set forth above, therefore, coverage of the fourth conductive film 11 that is positioned above the second conductive film 6*b* can be enhanced. The third conductive film 10 is formed to have the same thickness as the first conductive film 5 while the fourth conductive film 11 is formed to have the same thickness of the second conductive film 6. Here, sputtering is applied to sequentially form the third conductive film 10 (TaN film) and the fourth conductive film 11 (W film). Note that although the third conductive film 10 is formed of a TaN film while the fourth conductive film 11 is formed of a W film here, the invention is not limited to such materials. Each of the conductive films may be formed of an element selected among Ta, W, Ti, Mo, Al and Cu, or alloy or compound materials containing such element as a main component. Alternatively, a semiconductor film typified by a polycrystalline silicon film doped with impurity elements such as phosphorus may be used.

Figure 2B:
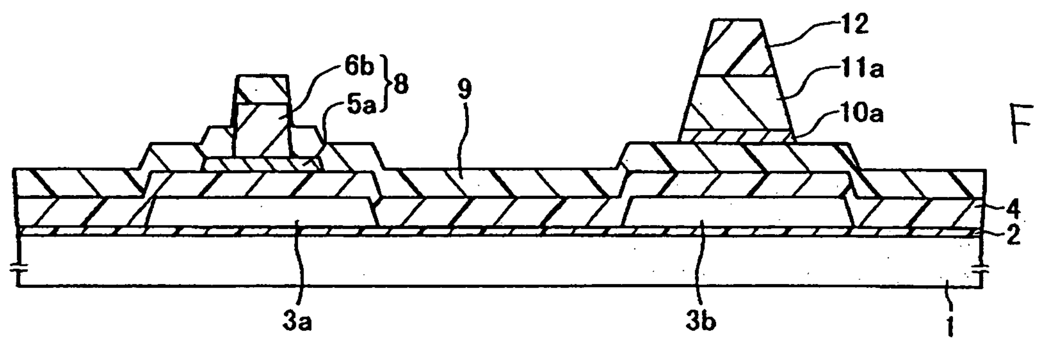

Then, as shown in FIG. 2B, a resist mask 12 is formed on the fourth conductive film 11 using a third photomask, and a first etching step is applied with an ICP etching system. According to the first etching step, the fourth conductive film 11 is etched to obtain a fourth conductive film 11*a* having tapered edges. At this time, due to an excellent coverage of the fourth conductive film 11 positioned above the second conductive film 6*b* of the first gate electrode 8 as set forth above, redundant portions of the fourth conductive film 11 of the CPU side can be removed more easily in the first etching step. Accordingly, defective etching resulting from a bad coverage of the fourth conductive film 11 can be avoided.

Then, a second etching step is applied using the resist mask 12 and an ICP etching system. According to the second etching step, the third conductive film 10 is etched to obtain a third conductive film 10*a* as shown in FIG. 2B. That is, the third conductive film 10*a* and the fourth conductive film 11*a* are formed over the semiconductor layer 3*a* with the first and second insulating films 4 and 9 interposed therebetween.

Note that the resist mask, the second conductive film and the first insulating film are slightly etched in the second etching step.

Here, two etching steps (the first etching step and the second etching step) are applied in order to suppress the reduction in thickness of the second insulating film 9, however, the number of etching steps is not specifically limited as long as an electrode structure (stacked layer of the fourth conductive film 11*a* and the third conductive film 10*a*) can be obtained, and an etching step can may be applied only once as well.

Figure 2C:
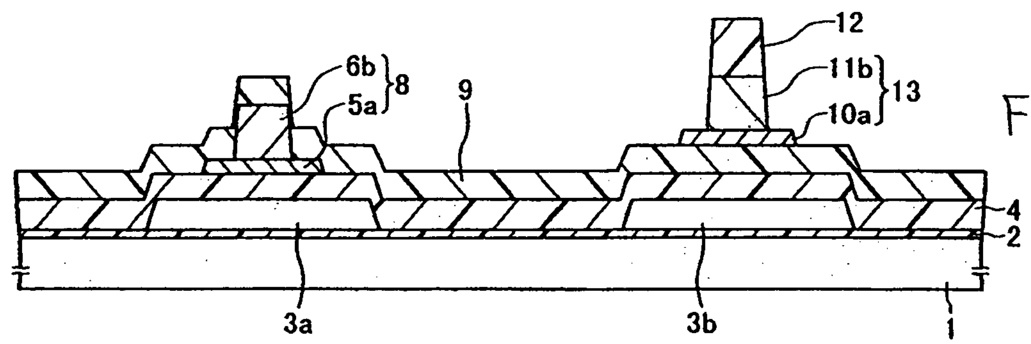

Then, a third etching step is applied using the resist mask 12 and an ICP etching system. According to the third etching step, the fourth conductive film 11*a* is etched to obtain a fourth conductive film 11*b* as shown in FIG. 2C. Accordingly, a second gate electrode 13 having a stacked layer of the third and fourth conductive films 11*b* and 10*a* is formed. A portion of the third conductive film 10*a* is exposed from the fourth conductive film 11*b*. Note that the resist mask, the third conductive film and the second insulating film are slightly etched in the third etching step.

Figure 3:
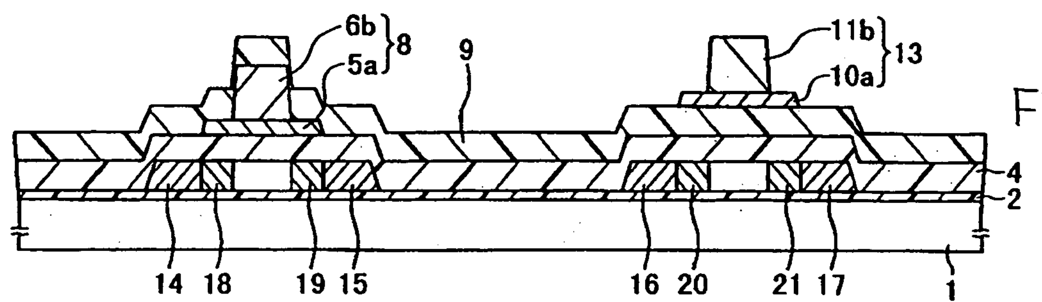
FIG. 3 is a cross-sectional diagram illustrating a manufacturing method of a semiconductor device according to Embodiment Mode 1 of the invention, following the step of FIG. 2C.

After removal of the resist mask 12, a first doping step is applied. According to the first doping step, through doping is carried out through the first and second insulating films 4 and 9 using the first to fourth conductive films 5*a*, 6*b*, 10*a* and 11*b* as masks. Accordingly, the semiconductor layers 3*a* and 3*b* are doped with high concentration impurities in a self-aligning manner, forming high concentration impurity regions (source and drain regions) 14 to 17 as shown in FIG. 3.

According to such through doping, quantities of dopant in the semiconductor layers 3*a* and 3*b* can be controlled to be a predetermined value.

Then, a second doping step is applied. According to the second doping step, through doping is carried out through the first and third conductive films 5*a* and 10*a* and the first and second insulating films 4 and 9 using the second and fourth conductive films 6*b* and 11*b* as masks. Accordingly, the semiconductor layers 3*a* and 3*b* are doped with low concentration impurities in a self-aligning manner, forming low concentration impurity regions (LDD regions) 18 to 21. Note that the high concentration impurity regions 14 to 17 are also doped with impurities in the second doping step.

In this embodiment mode, the first and second doping steps are applied after removal of the resist mask 12, however, the first and second doping steps can be applied without removing the mask 12 as well. In addition, the order of the first doping step and the second doping step may be changed. That is, the second doping step can be applied prior to the first doping step. Alternatively, instead of applying two doping steps: the first and second doping steps, only one doping step may be applied to simultaneously form the high concentration impurity regions and the low concentration impurity regions.

In this manner, on the substrate 1, a thin film transistor including the gate electrode 8, a gate insulating film formed of the first insulating film 4, the source and drain regions 14 and 15, and the LDD regions 18 and 19 is formed. Also, on the substrate 1, a transistor including the gate electrode 13, a gate insulating film formed of the first and second insulating films 4 and 9, the source and drain regions 16 and 17, and the LDD regions 20 and 21 is formed.

According to the aforementioned embodiment mode, a gate insulating film of a thin film transistor of one side (CPU side or panel side) is formed of the first insulating film 4 while a gate insulating film of a thin film transistor of the other side is formed of the first and second insulating films 4 and 9, thereby gate insulating films each having a different thickness can be formed on the same substrate.

In addition, since the first and second insulating films 4 and 9 are formed over the high concentration impurity regions 14 and 15 of a thin film transistor of one side while the first and second insulating films 4 and 9 are formed over the high concentration impurity regions 16 and 17 of a thin film transistor of the other side, the semiconductor layers 3*a* and 3*b* can be doped with high concentration impurities at a time so as to form high concentration impurity regions of substantially the same concentration. In this manner, since impurity doping can be applied at a time, simplified steps can be achieved.

In addition, the first insulating film 4, the first conductive film 5*a* and the second insulating film 9 are formed over the low concentration impurity regions 18 and 19 of a thin film transistor of one side while the first insulating film 4, the second insulating film 9 and the third conductive film 10*a* are formed over the low concentration impurity regions 20 and 21 of a thin film transistor of the other side, therefore, the first conductive film 5*a* and the third conductive film 10*a* are formed to have the same thickness. Accordingly, the semiconductor layers 3*a* and 3*b* are doped with low concentration impurities at a time, thereby low concentration impurity regions having substantially the same concentration can be formed. In this manner, since impurity doping can be applied at a time, simplified steps can be achieved.

Embodiment Mode 2

Figure 4:
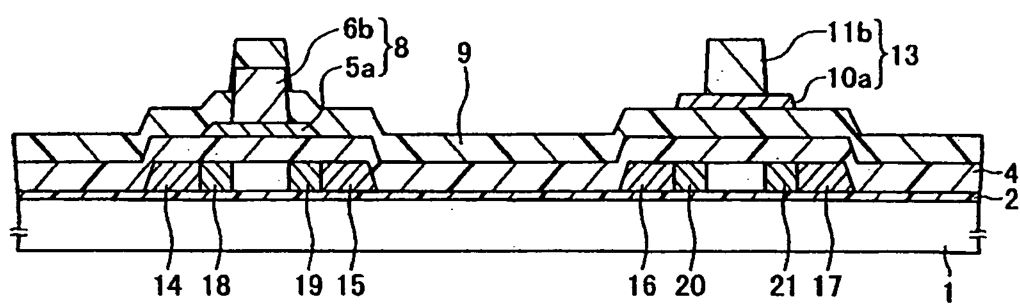
FIG. 4 is a cross-sectional diagram illustrating a manufacturing method of a semiconductor device according to Embodiment Mode 2 of the invention.

FIG. 4 is a cross-sectional diagram illustrating a manufacturing method of a semiconductor device according to Embodiment Mode 2 of the invention. Portions identical to those in FIGS. 1A to 3 are given the same reference numerals, and only different portions are described herein.

In this embodiment mode, description is made on the formation of LDD regions each having a different impurity concentration between the thin film transistor of the CPU side and the film transistor of the panel side that are formed on the same substrate without changing the thickness of the gate insulating films, residual films of the gate insulating films on the source and drain regions or multilayer structures of the gate insulating films and the gate electrodes of the CPU side and the panel side described in Embodiment Mode 1, but by changing only the thickness of the first conductive film 5*a* (TaN film) and the third conductive film 10*a* (TaN film).

When forming the third conductive film 10 over the second insulating film 9, the third conductive film 10 is formed thicker than the first conductive film 5. In this embodiment mode, for example, the third conductive film 10 is formed of a TaN film having a thickness of 35 nm while the first conductive film 5 is formed of a TaN film having a thickness of 30 nm.

That is, the third conductive film 10*a* of the second gate electrode 13 is formed thicker than the first conductive film 5*a* of the first gate electrode 8. Accordingly, when the second doping step is applied in which through doping is carried out through the first and third conductive films 5*a* and 10*a* and the first and second insulating films 4 and 9 using the second conductive film 6*b* and the fourth conductive film 11*b* as masks, the semiconductor layer 3*a* can be doped with a larger quantity of impurities than the semiconductor layer 3*b*. Accordingly, the low concentration impurity regions (LDD regions) 18 and 19 formed in the semiconductor layer 3*a* of the CPU side can have a higher impurity concentration than the low concentration impurity regions (LDD regions) 20 and 21 formed in the semiconductor layer 3*b* of the panel side.

In this embodiment mode, the thickness of the first and second conductive films 5*a* and 10*a*, conditions of the second doping step and the like are determined, for example such that: the impurity concentration of the LDD regions 18 and 19 of the CPU side is $1\times10^{18}$ atoms/cm$^3$, and the impurity concentration of the LDD regions 20 and 21 of the panel side is $5\times10^{17}$ atoms/cm$^3$.

According to this embodiment mode, an effect similar to Embodiment Mode 1 can be obtained.

In addition, according to this embodiment mode, by forming the third conductive film 10*a* thicker than the first conductive film 5*a*, the semiconductor layer 3*a* can be doped with a larger quantity of impurities than the semiconductor layer 3*b* even when the semiconductor layers 3*a* and 3*b* are doped with low concentration impurities at a time. Accordingly, the LDD regions 18 and 19 formed in the semiconductor layer 3*a* of the CPU side can have a higher impurity concentration than the LDD regions 20 and 21 formed in the semiconductor layer 3*b* of the panel side. Accordingly, LDD regions having different impurity concentrations can be formed when an optimal quantity of dopant against HC degradation is different between the LDD regions of the CPU side and the panel side.

Note that in this embodiment mode, the third conductive film 10 is formed thicker than the first conductive film 5, thereby the LDD regions 18 and 19 formed in the semiconductor layer 3*a* of the CPU side can have a higher impurity concentration than the LDD regions 20 and 21 formed in the semiconductor layer 3*b* of the panel side, however, the invention is not limited to this, and the following modification is possible to implement the invention. For example, the third conductive film 10 can be formed thinner than the first conductive film 5. In addition, the LDD regions 18 and 19 formed in the semiconductor layer 3*a* of the CPU side can have a lower impurity concentration than the LDD regions 20 and 21 formed in the semiconductor layer. 3*b* of the panel side. Alternatively, thickness of the gate insulating films can be controlled to be different between the CPU side and the panel side. In this manner, by appropriately changing the thickness of the gate insulating film, and the first and third conductive films, the LDD regions 18 and 19 formed in the semiconductor layer 3*a* of the CPU side can have a different/identical impurity concentration from/to those of the LDD regions 20 and 21 formed in the semiconductor layer 3*b* of the panel side.

In addition, the invention is not limited to the aforementioned embodiment mode, and various change and modification are possible without departing the broader spirit of the invention. For example, although the invention is applied to a thin film transistor of the CPU side and a thin film transistor of the panel side in the aforementioned Embodiment Modes 1 and 2, the invention is not limited to them, and can be applied to thin film transistors other than the ones for the CPU and the panel.

In addition, although the invention is applied to a semiconductor device in which a thin film transistor having an LDD region is formed on the CPU side, the invention can be applied to a semiconductor device in which a thin film transistor having no LDD region is formed on the CPU side as well.

What is claimed is:

1. A manufacturing method of a semiconductor device, comprising:

forming a first semiconductor layer and a second semiconductor layer over a substrate;

forming a first insulating film over the first semiconductor layer and the second semiconductor layer;

forming a first conductive film over the first insulating film;

forming a second conductive film over the first conductive film;

processing the second conductive film and the first conductive film so as to form a first gate electrode having a stacked layer of the second conductive film and the first conductive film over the first semiconductor layer with the first insulating film interposed therebetween, a portion of the first conductive film exposed from the second conductive film;

forming a second insulating film over the first gate electrode and the first insulating film;

forming a third conductive film over the second insulating film;

forming a fourth conductive film over the third conductive film; and processing the fourth conductive film and the third conductive film so as to form a second gate electrode having a stacked layer of the fourth conductive film and the third conductive film over the second semiconductor layer with the first and second insulating films interposed therebetween, a portion of the third conductive film exposed from the fourth conductive film.

2. A method according to claim 1, wherein the first conductive film has substantially the same thickness as the third conductive film.

3. A method according to claim 1, wherein the first conductive film is thinner than the third conductive film.

4. A method according to claim 1, wherein the first conductive film is thicker than the third conductive film.

5. A method according to claim 1, wherein the first conductive film has a different thickness from that of the third conductive film.

6. A method according to claim 1, wherein, after the formation of the second gate electrode over the second semiconductor layer with the first and second insulating films interposed therebetween, the first semiconductor layer and the second semiconductor layer are doped with impurities through the first insulating film and the second insulating film.

7. A method according to claim 1, wherein, after the formation of the second gate electrode over the second semiconductor layer with the first and second insulating films interposed therebetween, the first semiconductor layer and the second semiconductor layer are doped with impurities through the third conductive film exposed from the fourth conductive film, the first conductive film exposed from the second conductive film, the first insulating film and the second insulating film.

8. A method according to claim 1, wherein, after the formation of the second gate electrode over the second semiconductor layer with the first and second insulating films interposed therebetween, the first semiconductor layer and the second semiconductor layer are doped with impurities through the third conductive film exposed from the fourth conductive film, the first conductive film exposed from the second conductive film, the first insulating film and the second insulating film, thereby forming a high concentration impurity region and a low concentration impurity region in each of the first semiconductor layer and the second semiconductor layer.

9. A manufacturing method of a semiconductor device, comprising:

forming a first semiconductor layer and a second semiconductor layer over a substrate;

forming a first insulating film over the first semiconductor layer and the second semiconductor layer;

forming a first conductive film over the first insulating film;

forming a second conductive film over the first conductive film;

processing the second conductive film and the first conductive film so as to form a first gate electrode having a stacked layer of the second conductive film and the first conductive film over the first semiconductor layer with the first insulating film interposed therebetween, a portion of the first conductive film exposed from the second conductive film;

forming a second insulating film over the first gate electrode and the first insulating film;

forming a third conductive film which is thicker than the first conductive film over the second insulating film;

forming a fourth conductive film over the third conductive film;

processing the fourth conductive film and the third conductive film so as to form a second gate electrode having a stacked layer of the fourth conductive film and the third conductive film over the second semiconductor layer with the first and second insulating films interposed therebetween, a portion of the third conductive film exposed from the fourth conductive film;

doping first impurities to the first semiconductor layer and the second semiconductor layer through the first insulating film and the second insulating film; and doping second impurities to the first semiconductor layer and the second semiconductor layer through the third conductive film exposed from the fourth conductive film, the first conductive film exposed from the second conductive film, the first insulating film and the second insulating film, wherein the quantity of the second impurities doped to the first semiconductor layer is larger than the second impurities doped to the second semiconductor layer.

10. A manufacturing method of a semiconductor device, comprising:

forming a first semiconductor layer and a second semiconductor layer over a substrate;

forming a first insulating film over the first semiconductor layer and the second semiconductor layer;

forming a first conductive film over the first insulating film;

forming a second conductive film over the first conductive film;

processing the second conductive film and the first conductive film so as to form a first gate electrode having a stacked layer of the second conductive film and the first conductive film over the first semiconductor layer with the first insulating film interposed therebetween, a portion of the first conductive film exposed from the second conductive film;

forming a second insulating film over the first gate electrode and the first insulating film;

forming a third conductive film which is thinner than the first conductive film over the second insulating film;

forming a fourth conductive film over the third conductive film;

processing the fourth conductive film and the third conductive film so as to form a second gate electrode having a stacked layer of the fourth conductive film and the third conductive film over the second semiconductor layer with the first and second insulating films interposed therebetween, a portion of the third conductive film exposed from the fourth conductive film;

doping first impurities to the first semiconductor layer and the second semiconductor layer through the first insulating film and the second insulating film; and doping second impurities to the first semiconductor layer and the second semiconductor layer through the third conductive film exposed from the fourth conductive film, the first conductive film exposed from the second conductive film, the first insulating film and the second insulating film, wherein the quantity of the second impurities doped to the first semiconductor layer is smaller than the second impurities doped to the second semiconductor layer.

* * * * *